(12) United States Patent  (10) Patent No.: US 8,599,059 B1
Chung et al.  (45) Date of Patent: Dec. 3, 2013

(54) SUCCESSIVE APPROXIMATION REGISTER ANALOG-DIGITAL CONVERTER AND METHOD FOR OPERATING THE SAME

(75) Inventors: Yung-Hui Chung, Hsinchu (TW); Meng-Hsuan Wu, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 13/617,325

(22) Filed: Sep. 14, 2012

Related U.S. Application Data

(60) Provisional application No. 61/698,445, filed on Sep. 7, 2012.

(51) Int. Cl.
*H03M 1/12* (2006.01)

(52) U.S. Cl.
USPC .......................................... 341/172; 341/163

(58) Field of Classification Search
USPC ......................................................... 341/172
See application file for complete search history.

(56) References Cited

U.S. PATENT DOCUMENTS

| | | | | |
|---|---|---|---|---|
| 5,581,252 A | * | 12/1996 | Thomas | 341/144 |
| 6,587,066 B1 | * | 7/2003 | Somayajula | 341/172 |
| 6,720,903 B2 | * | 4/2004 | Confalonieri et al. | 341/172 |
| 7,432,844 B2 | * | 10/2008 | Mueck et al. | 341/163 |
| 7,501,974 B2 | * | 3/2009 | Confalonieri et al. | 341/172 |

* cited by examiner

*Primary Examiner* — Khai M Nguyen
(74) *Attorney, Agent, or Firm* — McClure, Qualey & Rodack, LLP

(57) ABSTRACT

A SAR ADC converting an analog signal into a digital signal having N bits counting from a most significant bit to a least significant bit includes a comparator comparing a positive component with a negative component of the analog signal, two CDACs and a logic circuit. For at least one i-th bit cycle of N bit cycle except a least significant bit cycle, one of a pair of capacitors relating to (i+1)-th bit respectively arranged in the two CDACs is switched according to a first comparing result of the comparator. After one of the pair of capacitors is switched, the comparator compares the positive component with the negative component of the analog signal again and generates a second comparing result. Then whether each one of capacitors relating to i-th bit in the two CDAC is to be switched is determined according to the first and the second comparing result.

10 Claims, 3 Drawing Sheets

SUCCESSIVE APPROXIMATION REGISTER ANALOG-DIGITAL CONVERTER AND METHOD FOR OPERATING THE SAME

CROSS REFERENCE TO RELATED APPLICATIONS

This Application claims the benefit of U.S. Provisional Application No. 61/698,445, filed on Sep. 7, 2012, the entirety of which is incorporated by reference herein.

BACKGROUND OF THE INVENTION

1. Field of the Invention

The invention relates generally to analog-to-digital converters (ADCs), and more particularly to successive approximation register analog-to-digital converters (SAR ADCs).

2. Description of the Related Art

Successive approximation register analog to digital converters (SAR ADCs) transform an analog input signal into a digital output signal through a binary algorithm which performs binary bit-to-bit comparisons. In a typical SAR ADC, each bit of a digital code (representing a sample of the analog input signal) is determined in a single iteration, starting from the most significant bit. To determine the most significant bit, the most significant bit is set to a specific logical value (for example, 1) and the following bits to the other logical value (for example, 0), and the resulting number is converted to the intermediate analog signal (by using a digital to analog converter (DAC), contained in the ADC). The value of the most significant bit of the digital code is determined to equal 0 if the sample of the analog signal has less voltage than the intermediate analog signal; otherwise, the value of the most significant bit of the digital code is determined to be 1. The approach is continued until all the bits of the digital code are determined For tolerating settling error, a type of SAR ADC uses redundant comparison cycles accomplished by using extra capacitors. However, in this type of SAR ADC, power consumption is increased because of increased input capacitance, and a signal-to-noise ratio worsens since an effective input range is lowered. Another type of SAR ADC uses double capacitor array DACs (digital to analog converters) to tolerate settling errors. Moreover, in this type of SAR ADC, more than one comparator is used. Accordingly, power consumption is increased and a larger area of the SAR ADC is required. Therefore, improving settling error tolerance without increasing power consumption or/and lowering efficiency is an important topic for SAR ADC development.

BRIEF SUMMARY OF THE INVENTION

In view of the above, an embodiment of the invention provides a successive approximation register analog-digital converter (SAR ADC), converting an analog input signal into a digital output signal having N bits counting from a most significant bit to a least significant bit, comprising: a comparator, comprising a positive input terminal coupled to a positive component of the analog input signal and a negative input terminal coupled to a negative component of the analog input signal; a first capacitor digital to analog converter (CDAC), comprising N capacitors $C_{1,1} \sim C_{1,N}$, wherein each of capacitors $C_{1,1} \sim C_{1,N-1}$ has a first terminal connected to the positive input terminal and a second terminal switchably connected to a first reference voltage or a second reference voltage, and the capacitor $C_{1,N}$ is connected between the positive input terminal and the second reference voltage; a second capacitor digital to analog converter (CDAC), comprising N capacitors $C_{2,1} \sim C_{2,N}$, wherein each of capacitors $C_{2,1} \sim C_{2,N-1}$ has a first terminal connected to the negative input terminal of the comparator and a second terminal switchably connected to the first reference voltage or the second reference voltage, and the capacitor $C_{2,N}$ is connected between the negative input terminal and the second reference voltage; and a logic circuit, connected to the comparator wherein for at least one i-th bit cycle of N bit cycle except a least significant bit cycle, the comparator compares a voltage of the positive input terminal with a voltage of the negative input terminal and outputs a first output signal to the logic circuit, the logic circuit determines whether the second terminal of the capacitor $C_{1,i+1}$ or $C_{2,i+1}$ is to be switched according to the first output signal, after the second terminal of the capacitor $C_{1,i+1}$ or $C_{2,i+1}$ is switched, the comparator compares the voltage of the positive input terminal with the voltage of the negative input terminal and outputs a second output signal to the logic circuit, and the logic circuit determines whether the second terminal of the capacitor $C_{1,i}$ is to be switched and whether the second terminal of the capacitor $C_{2,i}$ is to be switched according to the first and the second output signal.

Another embodiment of the invention provides a method for operating a successive approximation register analog-digital converter (SAR ADC), converting an analog input signal into a digital output signal having N bits counting from a most significant bit to a least significant bit, wherein the SAR ADC comprises: a comparator, comprising a positive input terminal coupled to a positive component of the analog input signal and a negative input terminal coupled to a negative component of the analog input signal; a first capacitor digital to analog converter (CDAC), comprising N capacitors $C_{1,1} \sim C_{1,N}$, wherein each of capacitors $C_{1,1} \sim C_{1,N-1}$ has a first terminal connected to the positive input terminal and a second terminal switchably connected to a first reference voltage or a second reference voltage, and the capacitor $C_{1,N}$ is connected between the positive input terminal and the second reference voltage; and a second capacitor digital to analog converter (CDAC), comprising N capacitors $C_{2,1} \sim C_{2,N}$, wherein each of capacitors $C_{2,1} \sim C_{2,N-1}$ has a first terminal connected to the negative input terminal of the comparator and a second terminal switchably connected to the first reference voltage or the second reference voltage, and the capacitor $C_{2,N}$ is connected between the negative input terminal and the second reference voltage, wherein the method comprises: for at least one i-th bit cycle of N bit cycle except a least significant bit cycle: comparing a voltage of the positive input terminal with a voltage of the negative input terminal and outputting a first output signal; determining whether the second terminal of the capacitor $C_{1,i+1}$ or $C_{2,i+1}$ is to be switched according to the first output signal; after the second terminal of the capacitor $C_{1,i+1}$ or $C_{2,i+1}$ is switched, comparing the voltage of the positive input terminal with the voltage of the negative input terminal and outputting a second output signal; and determining whether the second terminal of the capacitor $C_{1,i}$ is to be switched and whether the second terminal of the capacitor $C_{2,i}$ is to be switched according to the first and the second output signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
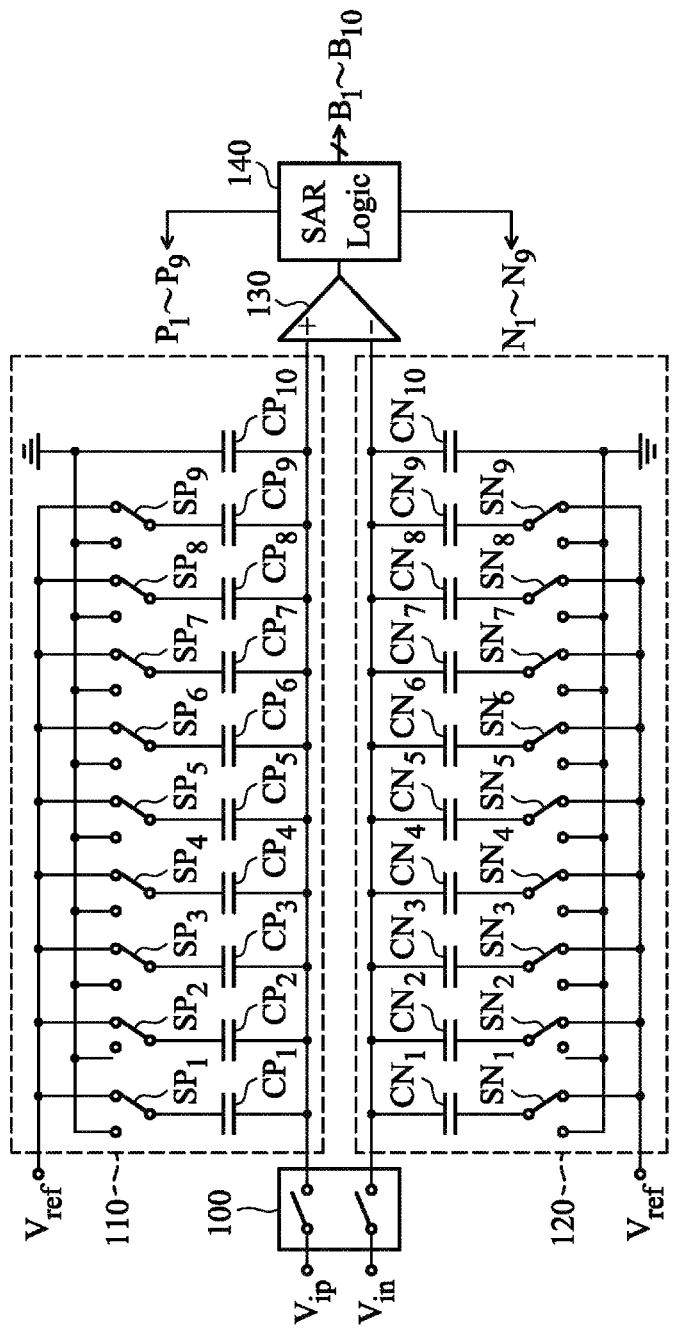
FIG. 1 is a block diagram of a SAR ADC according to an embodiment of the invention.

FIG. 1 is a block diagram of a 10-bit SAR ADC 10 according to an embodiment of the invention. The SAR ADC 10 comprises a switch 100, a capacitor digital to analog converter (CDAC) 110, a CDAC 120, a comparator 130 and SAR logic 140. The SAR ADC 10 transforms an analog input signal into a digital output signal having 10 bits. $V_{ip}$ and $V_{in}$ are the differential input signals of the SAR ADC 10. $V_{ip}$ is connected to a positive input terminal of the comparator 130 through the CDAC 110. $V_{in}$ is connected to a negative input terminal of the comparator 130 through the CDAC 120. $B_1$, $B_2$ . . . $B_{10}$ are binary outputs of the SAR ADC 10, i.e., the digital output signal converted from the analog input signal. The switch 100, closed for some time to sample a voltage onto the CDACs 110 and 120, may be a bootstrapped switch synchronized by a clock signal CLK. For each bit cycle, the comparator 130 compares the differential input signals and then outputs a comparing result to the SAR logic 140. The SAR logic 140 outputs the binary outputs $B_1$~$B_{10}$ and control signals $P_1$~$P_9$ and $N_1$~$N_9$ according to the comparing result of each bit cycle (details would be described later).

The CDAC 110 comprises capacitors $CP_1$~$CP_{10}$ and switches $SP_1$~$SP_9$. A terminal of a capacitor $CP_i$ (i=1~9) is connected to the positive input terminal of the comparator 130, while the other terminal is switched between a reference voltage $V_{ref}$ and a ground voltage by a corresponding switch $SP_i$. The switch $SP_i$ is controlled by the control signal $P_i$. The capacitor $CP_{10}$ is coupled between the reference voltage $V_{ref}$ and the positive input terminal of the comparator 130. Similarly, the CDAC 120 comprises capacitors $CN_1$~$CN_{10}$ and switches $SN_1$~$SN_9$. A terminal of a capacitor $CN_i$ (i=1~9) is connected to the negative input terminal of the comparator 130, while the other terminal is switched between the reference voltage $V_{ref}$ and the ground voltage by a corresponding switch $SN_i$. The switch $SN_i$ is controlled by the control signal $N_i$. The capacitor $CN_{10}$ is coupled between the reference voltage $V_{ref}$ and the negative input terminal of the comparator 130. For i=1~8, the capacitance of the capacitor $CP_i$ is two times the capacitance of the capacitor $CP_{(i+1)}$. The capacitance of the capacitor $CP_9$ is equal to the capacitance of the capacitor $CP_{10}$. For j=1~10, the capacitance of the capacitor $CN_j$ is equal to the capacitance of the capacitor $CP_j$. Capacitors $CP_1$ and $CN_1$ correspond to the most significant bit (MSB) $B_1$, and capacitors $CP_{10}$ and $CN_{10}$ correspond to the least significant bit (LSB) $B_{10}$. In an ideal SAR ADC, the reference voltage $V_{ref}$ is equal to the maximum allowed voltage difference of $V_{ip}$-$V_{in}$. The mechanism of the SAR ADC 10 is described at following.

For the first bit cycle (i.e. MSB cycle):

Step 1: The comparator 130 first compares $V_{ip}$ and $V_{in}$ and outputs a comparing result $bp_1$ to the SAR logic 140. For example, if $V_{ip}$ is larger than $V_{in}$, the comparing result $bp_1$ is logic 1 (high voltage level).

Step 2: The SAR logic 140 switches $SP_2$ or $SN_2$ by the control signal $P_2$ or $N_2$ according to the comparing result $bp_1$.

Step 3: After switching, the comparator 130 compares $V_{ip}$ and $V_{in}$ again and outputs a comparing result $bm_1$ to the SAR logic 140.

Step 4: Then the SAR logic 140 determines whether the switch $SP_1$ is going to be switched and whether the switch $SN_1$ is going to be switched according the comparing results $bp_1$ and $bm_1$. The first binary output $B_1$ is determined by the comparing results $bp_1$ and $bm_1$.

For the second bit cycle to the ninth bit cycle, steps Step 1~Step 4 described in the first bit cycle are repeated. For the last bit cycle (i.e. LSB cycle), that is, for the tenth bit cycle in this embodiment, the comparator 130 directly compares $V_{ip}$ and $V_{in}$ to obtain a comparing result $b_{10}$. The last binary output $B_{10}$ is determined by the comparing result $b_{10}$. The SAR ADC 10 may further comprise a 19-to-10 encoder (not shown).

As a result, the digital output $D_O$ of the SAR ADC 10 may be described as:

$$D_O = \sum_{i=1}^{i=9}(bp_i + bm_i) \cdot 2^{10-1-i} + b_{10},$$

wherein $2^{10-1-i}$ is a bit weight, $(bp_i+bm_i)$ is a combination of $bp_i$ and $bm_i$.

Figure 2:
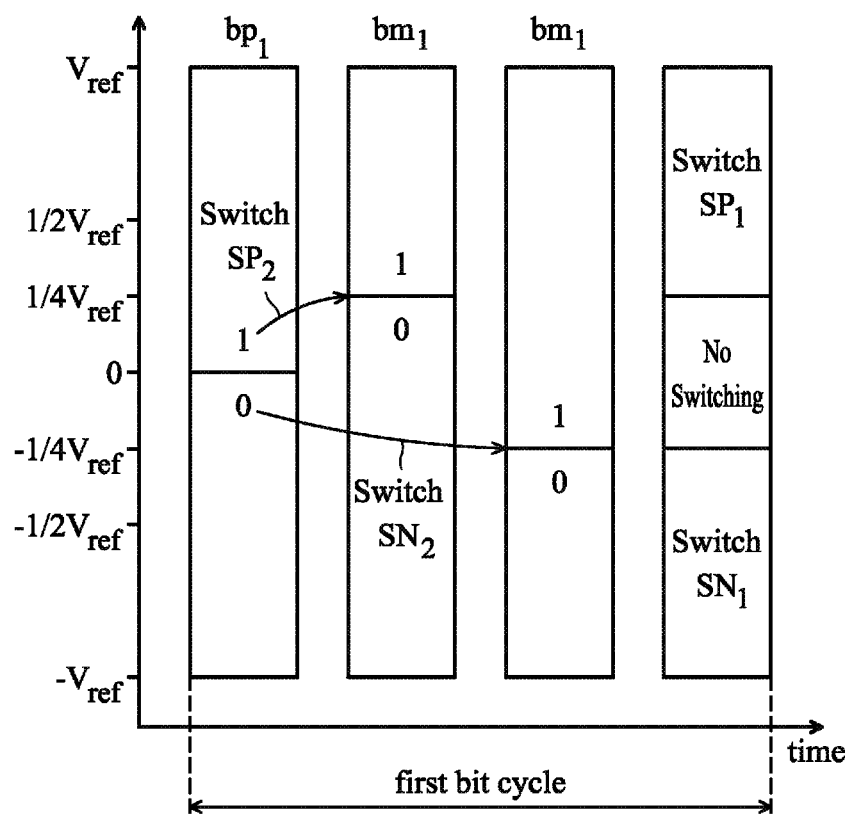
FIG. 2 is a block diagram of a switching mechanism of the first bit cycle of the SAR ADC in FIG. 1.

FIG. 2 is a block diagram of a switching mechanism of the first bit cycle of the SAR ADC 10 described above. In Step 1 of the first bit cycle, the comparator 130 compares $V_{ip}$ and $V_{in}$ and outputs the comparing result bp1. If $V_{ip}$>$V_{in}$ (that is, if $V_{ip}$-$V_{in}$>0), bp1 is 1, and the switch $SP_2$ is switched by the control signal $P_2$ in Step 2. If $V_{ip}$<$V_{in}$ (that is, if $V_{ip}$-$V_{in}$<0), bp1 is 0, and the switch $SN_2$ is switched by the control signal $N_2$ in Step 2. Then in Step 3, if $bp_1$ is 1, after the switch $SP_2$ is switched, the comparison in Step 3 is equivalent to determining whether ($V_{ip}$-$V_{in}$) is larger than (¼)×$V_{ref}$. If ($V_{ip}$-$V_{in}$)>(¼)×$V_{ref}$, the comparing result $bm_1$ is 1. If ($V_{ip}$-$V_{in}$)<(¼)×$V_{ref}$, the comparing result $bm_1$ is 0. If $bp_1$ is 0, after the switch $SN_2$ is switched, the comparison in Step 3 is equivalent to determining whether ($V_{ip}$-$V_{in}$) is larger than (-¼)×$V_{ref}$. If ($V_{ip}$-$V_{in}$)>(-¼)×$V_{ref}$, the comparing result $bm_1$ is 1. If ($V_{ip}$-$V_{in}$)<(-¼)×$V_{ref}$, the comparing result $bm_1$ is 0. In Step 4, whether the switch $SP_1$ is going to be switched and whether the switch $SN_1$ is going to be switched is determined according the comparing results $bp_1$ and $bm_1$. If ($bp_1$, $bm_1$) is (1, 1), only the switch $SP_1$ is switched. If ($bp_1$, $bm_1$) is (0, 0), only the switch $SN_1$ is switched. If ($bp_1$, $bm_1$) is (1, 0) or (0, 1), no switch is switched. The switching mechanism of each of the second bit cycle to the ninth bit cycle, similar to the switching mechanism of the first bit cycle, would not be described herein.

Figure 3:
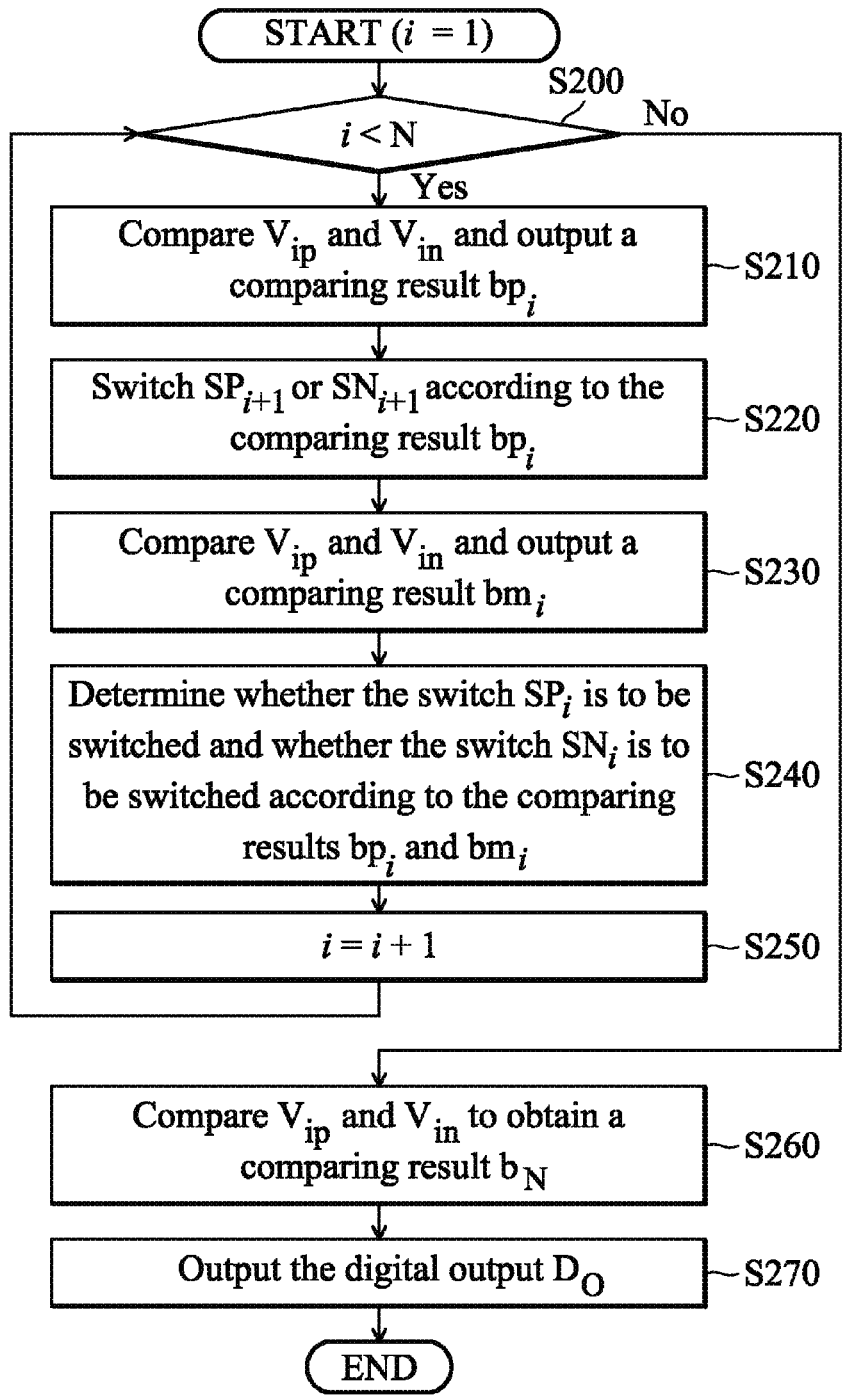
FIG. 3 is a flow chart of a method for operating an N-bit SAR ADC.

FIG. 3 is a flow chart of a method for operating an N-bit SAR ADC. The N-bit SAR ADC transforms an analog input signal into an N-bit digital output signal. Similar to the 10-bit SAR ADC 10 in FIG. 1, the N-bit SAR ADC comprises a switch, a first CDAC, a second CDAC, a comparator and SAR logic. $V_{ip}$ and $V_{in}$ are the differential input signals of the SAR ADC. $V_{ip}$ is connected to a positive input terminal of the comparator through the first CDAC. $V_{in}$ is connected to a negative input terminal of the comparator through the second CDAC. The first CDAC comprises capacitors $CP_1$~$CP_N$ and switches $SP_1$~$SP_{N-1}$. A terminal of a capacitor $CP_i$ (i=1~N-1) is connected to the positive input terminal of the comparator, while the other terminal is switched between a reference voltage $V_{ref}$ and a ground voltage by a corresponding switch $SP_i$. The switch $SP_i$ is controlled by the control signal $P_i$. The capacitor $CP_N$ is coupled between the reference voltage $V_{ref}$ and the positive input terminal of the comparator. Similarly, the second CDAC comprises capacitors $CN_1 \sim CN_N$ and switches $SN_1 \sim SN_{N-1}$. A terminal of a capacitor $CN_i$ (i=1~N-1) is connected to the negative input terminal of the comparator, while the other terminal is switched between the reference voltage $V_{ref}$ and the ground voltage by a corresponding switch $SN_i$. The switch $SN_i$ is controlled by the control signal $N_i$. The capacitor $CN_N$ is coupled between the reference voltage $V_{ref}$ and the negative input terminal of the comparator. For i=1~N-2, the capacitance of the capacitor $CP_i$ is two times the capacitance of the capacitor $CP_{i+1}$. The capacitance of the capacitor $CP_{N-1}$ is equal to the capacitance of the capacitor $CP_N$. For j=1~N, the capacitance of the capacitor $CN_j$ is equal to the capacitance of the capacitor $CP_j$. Capacitors $CP_1$ and $CN_1$ correspond to the most significant bit (MSB), and capacitors $CP_N$ and $CN_N$ correspond to the least significant bit (LSB). In an ideal SAR ADC, the reference voltage $V_{ref}$ is equal to the maximum allowed voltage difference of $V_{ip}-V_{in}$.

In step S200, whether i is smaller than N is determined. If i is smaller than N, the method proceeds to step S210. In step S210, the comparator compares $V_{ip}$ and $V_{in}$ and outputs a comparing result $bp_i$ to the SAR logic. For example, if $V_{ip}$ is larger than $V_{in}$, the comparing result $bp_i$ is logic 1 (high voltage level). In step S220, the SAR logic switches $SP_{i+1}$ or $SN_{i+1}$ by the control signal $P_{i+1}$ or $N_{i+1}$ according to the comparing result $bp_i$. If $bp_i$ is 1, $SP_{i+1}$ is switched. If $bp_i$ is 0, $SN_{i+1}$ is switched. In step S230, the comparator compares $V_{ip}$ and $V_{in}$ again and outputs a comparing result $bm_i$ to the SAR logic. In step S240, the SAR logic determines whether the switch $SP_i$ is going to be switched and whether the switch $SN_i$ is going to be switched according to the comparing results $bp_i$ and $bm_i$. Therefore, the i-th bit of the digital output signal is determined according to the comparing results $bp_i$ and $bm_i$. In step S250, i=i+1. Steps S210-S250 are repeated for i=2~N-1.

Take i=1 as an example. In step S210, the comparator compares $V_{ip}$ and $V_{in}$ and outputs a comparing result $bp_1$ to the SAR logic. If $V_{ip}>V_{in}$ (that is, if $V_{ip}-V_{in}>0$), $bp_1$ is 1. If $V_{ip}<V_{in}$ (that is, if $V_{ip}-V_{in}<0$), $bp_1$ is 0. Then in step S220, the SAR logic switches $SP_2$ or $SN_2$ according to the comparing result $bp_1$. If $V_{ip}-V_{in}>0$, $SP_2$ is switched. If $V_{ip}-V_{in}<0$, $SN_2$ is switched. In step S230, if $bp_1$ is 1, after the switch $SP_2$ is switched, the comparison between $V_{ip}$ and $V_{in}$ is equivalent to determining whether $(V_{ip}-V_{in})$ is larger than $(\frac{1}{4}) \times V_{ref}$. If $(V_{ip}-V_{in})>(\frac{1}{4}) \times V_{ref}$, the comparing result $bm_1$ is 1. If $(V_{ip}-V_{in})<(\frac{1}{4}) \times V_{ref}$, the comparing result $bm_1$ is 0. If $bp_1$ is 0, after the switch $SN_2$ is switched, the comparison between $V_{ip}$ and $V_{in}$ is equivalent to determining whether $(V_{ip}-V_{in})$ is larger than $(-\frac{1}{4}) \times V_{ref}$. If $(V_{ip}-V_{in})>(-\frac{1}{4}) \times V_{ref}$, the comparing result $bm_1$ is 1. If $(V_{ip}-V_{in})<(-\frac{1}{4}) \times V_{ref}$, the comparing result $bm_1$ is 0. Then in step S240, whether the switch $SP_1$ is going to be switched and whether the switch $SN_1$ is going to be switched is determined according the comparing results $bp_1$ and $bm_1$. If $(bp_1, bm_1)$ is (1, 1), only the switch $SP_1$ is switched. If $(bp_1, bm_1)$ is (0, 0), only the switch $SN_1$ is switched. If $(bp_1, bm_1)$ is (1, 0) or (0, 1), no switch is switched.

After step S250, the method returns to step S200. Steps S210~S250 are repeated for remaining i=2~N-1. In step S200, if i is not smaller than N, for example, when i=N, the method proceeds to step S260. In step S260, the comparator directly compares $V_{ip}$ and $V_{in}$ to obtain a comparing result $b_N$. In step S270, the SAR logic outputs the digital output $D_O$ according to comparing results $bp_1 \sim bp_{N-1}$, $bm_1 \sim bm_{N-1}$ and $b_N$, wherein the digital output $D_O$ may be described as:

$$D_O = \sum_{i=1}^{i=N-1} (bp_i + bm_i) \cdot 2^{N-1-i} + b_N,$$

wherein $2^{N-1-i}$ is a bit weight, $(bp_i+bm_i)$ is a combination of $bp_i$ and $bm_i$.

The SAR ADC described above may further comprises an (2×N-1) to N encoder, receiving comparing results $bp_1 \sim bp_{N-1}$, $bm_1 \sim bm_{N-1}$ and $b_N$ and outputting the digital output $D_O$.

Notice that though the method described in FIG. 3 applies steps S210~S240 to the first bit cycle and the second bit cycle to the $N-1^{th}$ bit cycle, the method may apply steps S210~S240 to, for example, only the first, second and third bit cycle. The other bit cycles may use conventional switching mechanism. That is, the switching mechanism on the invention may be applied to at least one bit cycle.

The switching mechanism described above uses two comparison and two switching determination so as to tolerate settling errors without introducing additional analog elements, such as an additional comparator. According to simulation results of the SAR ADC of the invention, the SAR ADC of the invention has better SNDR (Signal-to-noise and distortion ratio) and INL (integral nonlinearity) performance than the SAR ADCs in the prior art. Furthermore, the SAR ADC of the invention uses lower average switching energy. For example, in a 10-bit simulation, the average energy of the conventional SAR ADC is 1363 ($C \times V_{ref}^2$), the average energy of the SAR ADC using redundant comparison cycles is 380 ($C \times V_{ref}^2$), and the average energy of the SAR ADC according to the embodiment described above is 335 ($C \times V_{ref}^2$). Therefore, the SAR ADC of the invention may tolerate more settling errors than the prior art without decreasing SNDR and INL performance and increasing power consumption.

Methods and systems of the present disclosure, or certain aspects or portions of embodiments thereof, may take the form of a program code (i.e., instructions) embodied in media, such as floppy diskettes, CD-ROMS, hard drives, firmware, or any other non-transitory machine-readable storage medium, wherein, when the program code is loaded into and executed by a machine, such as a computer, the machine becomes an apparatus for practicing embodiments of the disclosure. The methods and apparatus of the present disclosure may also be embodied in the form of a program code transmitted over some transmission medium, such as electrical wiring or cabling, through fiber optics, or via any other form of transmission, wherein, when the program code is received and loaded into and executed by a machine, such as a computer, the machine becomes an apparatus for practicing and embodiment of the disclosure. When implemented on a general-purpose processor, the program code combines with the processor to provide a unique apparatus that operates analogously to specific logic circuits.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A successive approximation register analog-digital converter (SAR ADC), converting an analog input signal into a digital output signal having N bits counting from a most significant bit to a least significant bit, comprising:

a comparator, comprising a positive input terminal coupled to a positive component of the analog input signal and a negative input terminal coupled to a negative component of the analog input signal;

a first capacitor digital to analog converter (CDAC), comprising N capacitors $C_{1,1}$~$C_{1,N}$, wherein each of capacitors $C_{1,1}$~$C_{1,N-1}$ has a first terminal connected to the positive input terminal and a second terminal switchably connected to a first reference voltage or a second reference voltage, and the capacitor $C_{1,N}$ is connected between the positive input terminal and the second reference voltage;

a second capacitor digital to analog converter (CDAC), comprising N capacitors $C_{2,1}$~$C_{2,N}$, wherein each of capacitors $C_{2,1}$~$C_{2,N-1}$ has a first terminal connected to the negative input terminal of the comparator and a second terminal switchably connected to the first reference voltage or the second reference voltage, and the capacitor $C_{2,N}$ is connected between the negative input terminal and the second reference voltage; and a logic circuit, connected to the comparator wherein for at least one i-th bit cycle of N bit cycle except a least significant bit cycle, the comparator compares a voltage of the positive input terminal with a voltage of the negative input terminal and outputs a first output signal to the logic circuit, the logic circuit determines whether the second terminal of the capacitor $C_{1,i+1}$ or $C_{2,i+1}$ is to be switched according to the first output signal, after the second terminal of the capacitor $C_{1,i+1}$ or $C_{2,i+1}$ is switched, the comparator compares the voltage of the positive input terminal with the voltage of the negative input terminal and outputs a second output signal to the logic circuit, and the logic circuit determines whether the second terminal of the capacitor $C_{1,i}$ is to be switched and whether the second terminal of the capacitor $C_{2,i}$ is to be switched according to the first and the second output signal.

2. The SAR ADC as claimed in claim 1, wherein after all the N bit cycles are finished, the logic circuit generates the digital output signal matched to the analog input signal according to output signals of the comparator of all the N bit cycles.

3. The SAR ADC as claimed in claim 2, wherein for i=1~N−2, the capacitance of the capacitor $C_{j,i}$ is two time the capacitance of the capacitor $C_{j,i+1}$, and the capacitance of the capacitor $C_{j,N-1}$ is equal to the capacitance of the capacitor $C_{j,N}$, and wherein j is 1 or 2.

4. The SAR ADC as claimed in claim 1, further comprising:

a switch circuit, comprising a first switch coupled between the positive component of the analog input signal and the positive input terminal and a second switch coupled between the negative component of the analog input signal and the negative input terminal 5. The SAR ADC as claimed in claim 1, wherein the second terminal of each of the capacitors $C_{1,1}$~$C_{1,N-1}$ and $C_{2,1}$~$C_{2,N-1}$ is connected to the first reference voltage or the second reference voltage through a switch controlled by the logic circuit.

6. The SAR ADC as claimed in claim 1, wherein the second reference voltage is a ground voltage.

7. A method for operating a successive approximation register analog-digital converter (SAR ADC), converting an analog input signal into a digital output signal having N bits counting from a most significant bit to a least significant bit, wherein the SAR ADC comprises:

a comparator, comprising a positive input terminal coupled to a positive component of the analog input signal and a negative input terminal coupled to a negative component of the analog input signal;

a first capacitor digital to analog converter (CDAC), comprising N capacitors $C_{1,1}$~$C_{1,N}$, wherein each of capacitors $C_{1,1}$~$C_{1,N-1}$ has a first terminal connected to the positive input terminal and a second terminal switchably connected to a first reference voltage or a second reference voltage, and the capacitor $C_{1,N}$ is connected between the positive input terminal and the second reference voltage; and a second capacitor digital to analog converter (CDAC), comprising N capacitors $C_{2,1}$~$C_{2,N}$, wherein each of capacitors $C_{2,1}$~$C_{2,N-1}$ has a first terminal connected to the negative input terminal of the comparator and a second terminal switchably connected to the first reference voltage or the second reference voltage, and the capacitor $C_{2,N}$ is connected between the negative input terminal and the second reference voltage, wherein the method comprises:

for at least one i-th bit cycle of N bit cycle except a least significant bit cycle:

comparing a voltage of the positive input terminal with a voltage of the negative input terminal and outputting a first output signal determining whether the second terminal of the capacitor $C_{1,i+1}$ or $C_{2,i+1}$ is to be switched according to the first output signal;

after the second terminal of the capacitor $C_{1,i+1}$ or $C_{2,i+1}$ is switched, comparing the voltage of the positive input terminal with the voltage of the negative input terminal and outputting a second output signal; and determining whether the second terminal of the capacitor $C_{1,i}$ is to be switched and whether the second terminal of the capacitor $C_{2,i}$ is to be switched according to the first and the second output signal.

8. The method as claimed in claim 7, further comprising:

after finishing all the N bit cycles, generating the digital output signal matched to the analog input signal according to output signals of the comparator of all the N bit cycles.

9. The method as claimed in claim 8, wherein for i=1~N−2, the capacitance of the capacitor $C_{j,i}$ is two time the capacitance of the capacitor $C_{j,i+1}$, and the capacitance of the capacitor $C_{j,N-1}$ is equal to the capacitance of the capacitor $C_{j,N}$, and wherein j is 1 or 2.

10. The method as claimed in claim 7, wherein the second reference voltage is a ground voltage.

* * * * *